(12) United States Patent
Kim

(10) Patent No.: US 7,834,557 B2
(45) Date of Patent: Nov. 16, 2010

(54) ORGANIC LIGHT EMITTING DISPLAY AND METHOD OF MANUFACTURING THE SAME

(75) Inventor: Yang-wan Kim, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 450 days.

(21) Appl. No.: 12/071,107

(22) Filed: Feb. 15, 2008

(65) Prior Publication Data
US 2008/0203931 A1 Aug. 28, 2008

(30) Foreign Application Priority Data
Feb. 27, 2007 (KR) .................. 10-2007-0019571

(51) Int. Cl.
G09G 3/10 (2006.01)
H01L 29/161 (2006.01)

(52) U.S. Cl. .............. 315/169.3; 257/84; 257/E51.017; 257/E51.018

(58) Field of Classification Search ... 315/161.1–169.4; 257/84, 918, E51.017, E51.018, E51.022, 257/E51.025; 345/76–82
See application file for complete search history.

(56) References Cited

U.S. PATENT DOCUMENTS

| 6,590,227 B2 * | 7/2003 | Ishikawa | 257/68 |
| 6,833,560 B2 * | 12/2004 | Konuma et al. | 257/72 |
| 7,132,801 B2 * | 11/2006 | Park et al. | 315/169.3 |
| 7,378,739 B2 | 5/2008 | Kwak et al. | |
| 7,626,194 B2 * | 12/2009 | Han | 257/40 |
| 2004/0196223 A1 | 10/2004 | Kwon | |
| 2005/0052366 A1 | 3/2005 | Kim | |
| 2006/0139264 A1 | 6/2006 | Choi et al. | |
| 2007/0075937 A1 | 4/2007 | Kim | |

FOREIGN PATENT DOCUMENTS

| JP | 2006-030635 | 2/2006 |
| KR | 10-2003-0035219 A | 5/2003 |
| KR | 10-2003-0058148 A | 7/2003 |
| KR | 10-2004-0085575 A | 10/2004 |
| KR | 10-2004-0085654 A | 10/2004 |
| KR | 10-2005-0025510 A | 3/2005 |
| KR | 10-2005-0113693 A | 12/2005 |
| KR | 10-2006-0071679 A | 6/2006 |
| KR | 10-2006-0073702 A | 6/2006 |

* cited by examiner

Primary Examiner—Doulas W Owens
Assistant Examiner—Jimmy T Vu
(74) Attorney, Agent, or Firm—Lee & Morse, P.C.

(57) ABSTRACT

A light emitting display includes a substrate, a semiconductor layer on the substrate, a first insulation layer on the semiconductor layer, a first electrode layer and a second electrode layer on the first insulation layer, the first electrode layer having a first length and the second electrode layer having a second length, the first electrode layer corresponding to a storage capacitor, the second electrode layer corresponding to a boosting capacitor, a second insulation layer on the first electrode layer and the second electrode layer, and a third electrode layer on the second insulation layer, wherein a length of a first portion of the third electrode layer that overlaps the first electrode layer is longer than a length of a second portion of the third electrode layer that overlaps the second electrode layer.

16 Claims, 6 Drawing Sheets

ORGANIC LIGHT EMITTING DISPLAY AND METHOD OF MANUFACTURING THE SAME

BACKGROUND OF THE INVENTION

1. Field of the Invention

Embodiments relate to an organic light emitting display. More particularly, embodiments relate to organic light emitting displays capable of supplying a predetermined current to an organic light emitting diode and a method of manufacturing such organic light emitting displays.

2. Description of the Related Art

Various types of flat panel display devices that are lighter in weight and smaller in volume than a cathode ray tube having a substantially same screen size are being developed. Such flat panel display devices include liquid crystal displays, field emission displays, plasma display panels, and organic light emitting displays.

The organic light emitting displays display an image using organic light emitting diodes (OLEDs) that generate light by the recombination of electrons and holes. In general, organic light emitting displays have a fast response speed and consume relatively less power. A light emitting display device may generate light in an organic light emitting diode by supplying a current corresponding to a data signal to the organic light emitting diode using a drive transistor formed in each pixel.

Each pixel includes a plurality of transistors and a plurality of capacitors for compensating for a threshold voltage of the drive transistor. In such cases, for each of the pixels, an amount of current supplied to the respective OLED depends on a capacitance of each of the capacitors included in the pixel. As a result, it may be very difficult to reliably supply a predetermined current to the respective OLEDs. An organic light emitting display including a pixel(s), which includes at least two capacitors and an OLED, that is capable of supplying a stable current to the OLED by regulating the capacitances of the capacitors, and a method of manufacturing such a capacitor are desired.

SUMMARY OF THE INVENTION

Embodiments are directed to a light emitting display, e.g., an organic light emitting display, and a method of manufacturing thereof, which substantially overcome one or more of the problems due to the limitations and disadvantages of the related art.

It is therefore a feature of an embodiment of the invention to provide a light emitting display, e.g., an organic light emitting display, and a method of manufacturing such a light emitting display employing a boosting capacitor and a storage capacitor in a pixel thereof, which may enable an image of a predetermined brightness to be displayed.

It is therefore a feature of an embodiment of the invention to provide an organic light emitting display capable of supplying a predetermined current to an organic light emitting diode and a method for manufacturing such an organic light emitting display.

At least one of the above and other features and advantages of the invention may be realized by providing an organic light emitting display including a boosting capacitor and a storage capacitor in each pixel region thereof, the light emitting display including a substrate, a semiconductor layer on the substrate, a first insulation layer on the semiconductor layer, a first electrode layer and a second electrode layer on the first insulation layer, the first electrode layer having a first length and the second electrode layer having a second length, the first electrode layer corresponding to the storage capacitor, the second electrode layer corresponding to the boosting capacitor, a second insulation layer on the first electrode layer and the second electrode layer, and a third electrode layer on the second insulation layer, wherein a length of a first portion of the third electrode layer that overlaps the first electrode layer is longer than a length of a second portion of the third electrode layer that overlaps the second electrode layer.

The third electrode layer may be electrically coupled to the semiconductor layer via a contact hole. The first length may be longer than the second length. Overlapping portions of the semiconductor layer and the second electrode layer may correspond to a first sub-boosting capacitor and overlapping portions of the second electrode layer and the second portion of the third electrode layer may correspond to a second sub-boosting capacitor, and the first sub-boosting capacitor and the second sub-boosting capacitor may together correspond to the boosting capacitor.

Overlapping portions of the semiconductor layer and the first electrode layer correspond to a first sub-storage capacitor and overlapping portions of the first electrode layer and the first portion of the third electrode layer may correspond to a second sub-storage capacitor, and the first sub-storage capacitor and the second sub-storage capacitor may together correspond to the storage capacitor.

A boosting ratio corresponding to a capacitance of the first sub-boosting capacitor divided by a capacitance of the second sub-boosting capacitor may be greater than a storage ratio corresponding to a capacitance of the first storage capacitor divided by a capacitance of the second storage capacitor.

A capacitance of the boosting capacitor may be less than a capacitance of the storage capacitor.

The second length may be different from the first length. The first length may be longer than the second length. A first terminal of the boosting capacitor may be coupled to a first terminal of the storage capacitor, a second terminal of the boosting capacitor may be coupled to a scan line, and a second terminal of the storage capacitor is coupled to a first power source.

At least one of the above and other features and advantages of the invention may be separately realized by providing a method of manufacturing an organic light emitting display, the method including forming a semiconductor layer in each pixel region on a substrate, forming a first insulation layer on the semiconductor layer, forming a first electrode layer having a first length and corresponding to a storage capacitor and a second electrode layer having a second length, the first electrode layer corresponding to a storage capacitor and the second electrode corresponding to a boosting capacitor, forming a second insulation layer on the first electrode layer and the second electrode layer, and forming a third electrode layer on the second insulation layer, wherein a length of a first portion of the third electrode layer that overlaps the first electrode layer is longer than a length of a second portion of the third electrode layer that overlaps the second electrode layer.

The method may further include forming a contact hole exposing a portion of the semiconductor layer between the first electrode layer and the second electrode layer after forming the second insulation layer, wherein forming the third electrode layer comprises forming the third electrode layer by filling the contact hole so that the third electrode layer is electrically coupled to the semiconductor layer through the contact hole. A ratio of an overlapping area of the second electrode layer and the semiconductor layer divided by an overlapping area of the second electrode layer and the second portion of the third electrode layer may be larger than an overlapping area of the first electrode layer and the semiconductor layer divided an overlapping area of the first electrode layer and the first portion of the third electrode layer.

The method may further include forming a third insulation layer on the third electrode layer, and forming an organic light emitting diode layer on the third insulation layer. The second length may be different from the first length.

At least one of the above and other features and advantages of the invention may be separately realized by providing a light emitting display including a plurality of pixel regions, each pixel region may include a plurality of transistors on a substrate, a boosting capacitor coupled between control electrodes of two of the plurality of transistors, a storage capacitor including a first terminal coupled to a first terminal of the boosting capacitor and a second terminal coupled to a first power source, wherein the boosting capacitor is adapted to increase a voltage at the first terminal of the storage capacitor, a capacitance of the boosting capacitor is less than a capacitance of the storage capacitor, and a change in the capacitance of the boosting capacitor is offset by a change in the capacitance of the storage capacitor.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
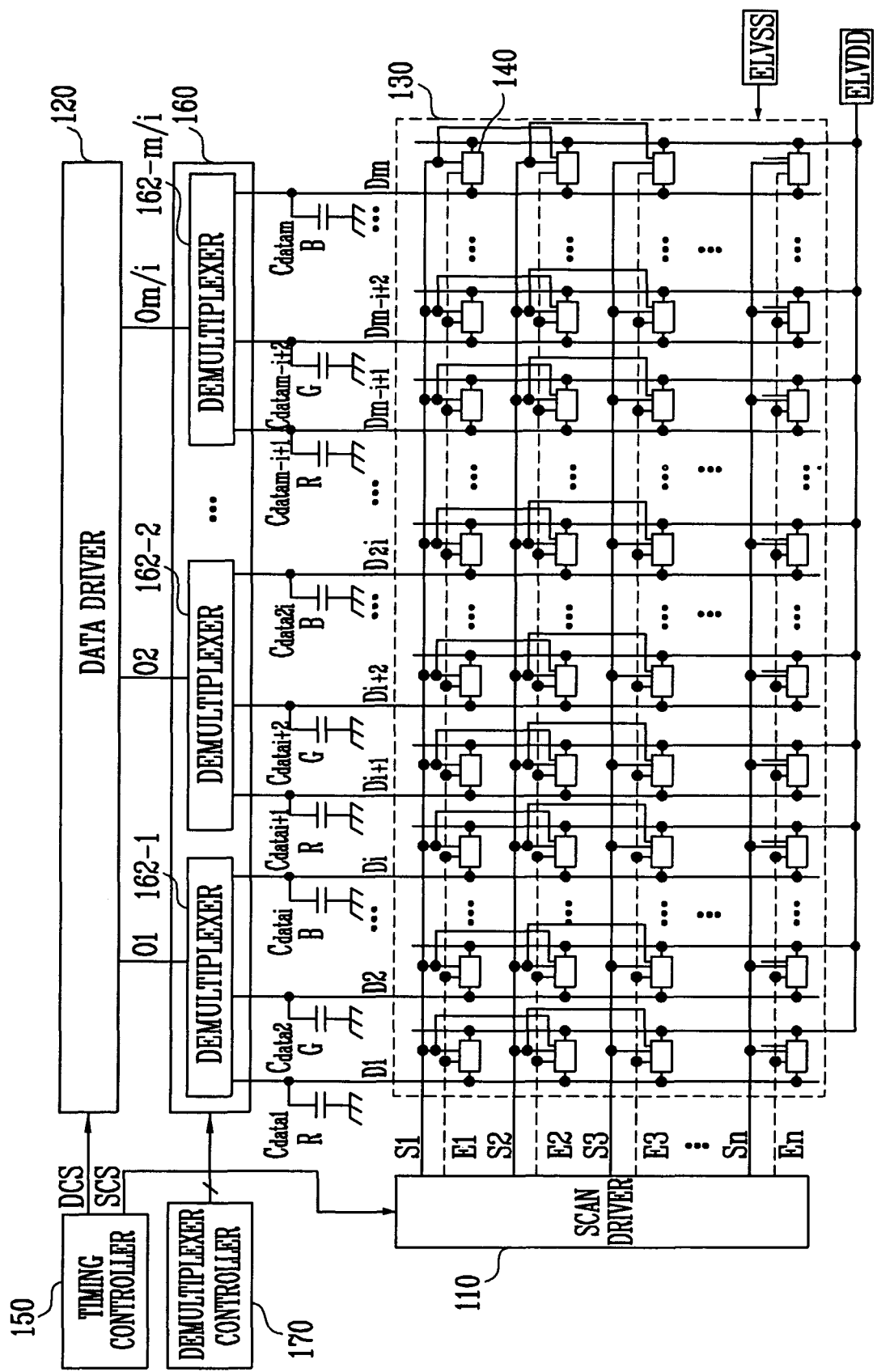
FIG. 1 illustrates a block diagram of an organic light emitting display according to an exemplary embodiment of the invention.

Korean Patent Application No. 10-2007-0019571, filed on Feb. 27, 2007, in the Korean Intellectual Property Office, and entitled: "Organic Light Emitting Display and Method of Manufacturing the Same," is incorporated by reference herein in its entirety.

Exemplary embodiments of the invention will now be described more fully hereinafter with reference to the accompanying drawings, in which exemplary embodiments of the present invention are illustrated. Aspects of the invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art.

In the figures, the dimensions of layers and regions may be exaggerated for clarity of illustration. It will also be understood that when an element is referred to as being "between" two elements, it may be the only element between the two elements, or one or more intervening elements may also be present. It will also be understood that when an element is referred to as being "on," "above," "below," or "under" another element, it may be directly "on," "above," "below," or "under" the other element, or one or more intervening elements may be present. Like reference numerals refer to like elements throughout the specification.

Figure 2:
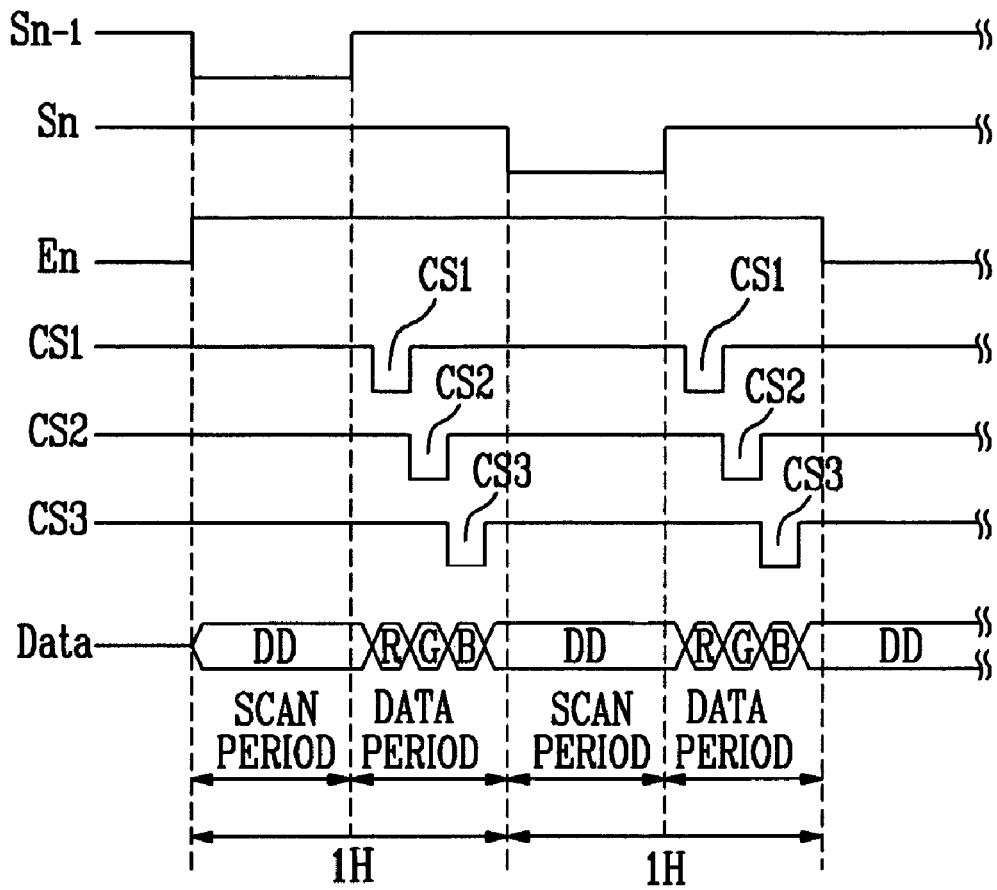
FIG. 2 illustrates a timing diagram of signals employable by an exemplary method for driving the organic light emitting display shown in FIG. 1 according to an exemplary embodiment of the invention.

FIG. 1 illustrates a block diagram of an organic light emitting display as an exemplary embodiment of the invention. FIG. 2 illustrates a timing diagram of signals employable by an exemplary method for driving the organic light emitting display shown in FIG. 1 according to an exemplary embodiment of the invention.

Referring to FIG. 1, the organic light emitting display may include a scan driver 110, a data driver 120, a pixel section 130, a timing controller 150, a demultiplexer block section 160, a demultiplexer controller 170, and a plurality of data capacitors Cdata.

The pixel section 130 may include a plurality of pixels 140 located in regions defined by respective portions of scan lines S1 to Sn and data lines D1 to Dm. Each of the pixels 140 may generate a light of a predetermined brightness corresponding to a data signal supplied from the data line D. Each of the pixels 140 may be coupled to two of the scan lines S1 to Sn, one of the data lines D1 to Dm, a power source line for supplying a first power source voltage ELVDD, and an initialization line (not shown) for supplying an initialization power source. For example, each of the pixels 140 in a last row of pixels may be coupled to the (n−1)th scan line Sn−1, the nth scan line Sn, a respective one of the data lines D1 to Dm, the power source line, and the initialization line. Each of the pixels 140 in a first row of pixels may be coupled, e.g., to a $0^{th}$ scan line S0 (not shown), the first scan line S1, a respective one of the data lines D1 to Dm, the power source line, and the initialization line.

The timing controller 150 may generate a data drive control signal DCS and a scan drive control signal SCS corresponding to externally supplied synchronizing signals. The data drive control signal(s) DCS produced in the timing controller 150 may be supplied to the data driver 120 and the scan drive control signal(s) SCS may be supplied to the scan driver 110.

The scan driver 110 may generate a scan signal(s) in response to a scan drive control signal SCS supplied from the timing controller 150. The scan driver 110 may sequentially supply the generated scan signal(s) to the scan lines S1 to Sn, respectively.

As shown in FIG. 2, the scan driver 110 may supply the respective scan signal(s) only during a portion of each horizontal period 1H, e.g., a first horizontal period 1H. More particularly, in some embodiments, each horizontal period 1H for driving, e.g., a row of the pixels 140 in the pixel section 130, may include a scan period for supplying a respective scan signal(s) and a data period for supplying a respective data signal(s). For example, each of the horizontal periods 1H may be divided between a scan period and a data period. More particularly, e.g., during a scan period of a horizontal period for driving the pixels 140 in the (n−1)th scan line Sn−1, the scan driver 110 may supply a scan signal, e.g., having a low level, to the (n−1)th scan line Sn−1, and during a data period of the horizontal period 1H for driving the pixels 140 in the (n−1)th line Sn−1, the scan driver 110 may supply no scan signal, e.g., a scan signal having, a high level, to the (n−1)th scan line.

The scan driver 110 may also generate a light emission control signal(s) in response to a scan drive control signal SCS. The scan driver 110 may sequentially supply the generated light emission control signal(s) to light emission control lines E1 to En. Each of the light emission control signals may be supplied, e.g., changed to a high voltage level, for at least two horizontal periods 1H. More particularly, as shown in FIG. 2, in some embodiments, each of the light emission control signals may be supplied, e.g., changed to a high voltage level, for two consecutive horizontal periods 1H.

The data driver 120 may generate data signal(s) in response to a data drive control signal DCS supplied from the timing controller 150. The data driver 120 may supply the generated data signal(s) to output lines O1 to Om/i, respectively. More particularly, in some embodiments, the data driver 120 may sequentially supply at least i (i is a natural number greater than 2) data signals to each of the output lines O1 to Om/i during one horizontal period 1H.

The demultiplexer block section 160 may include m/i demultiplexers 162-1 to 162-Om/i. That is, the demultiplexer block section 160 may include a same number of demultiplexers as a number of the output lines O1 to Om/i of the data driver 120. Each of the demultiplexers 162-1 to 162-Om/i may be coupled to a respective one of the output lines O1 to Om/i and/or to i data lines D.

The demultiplexer block section 160 may receive the data signals from the data driver 120. In some embodiments, during each of the data periods, the data driver 120 may sequentially supply i data signals to each of the demultiplexers 162-1 to 162-Om/i, via the respective output lines O1 to Om/i. Further, during each data period, each of the demultiplexers 162 may supply the i number of data signals supplied thereto, from the data driver 120 via the respective output line O, to the i number of data lines D associated therewith. For example, during each data period, the demultiplexer 162-2 coupled to the second output line O2 may receive the respective i number of data signals, from the data driver 120 via the second output line O2, and may output i number of data signals to the data lines Di+1 to D2i associated therewith.

Referring to FIGS. 1 and 2, in some embodiments, each of the demultiplexers 162-1 to 162-Om/i may be associated with a pixel unit, e.g., three adjacent pixels 140 in a row of the pixels 140. Thus, during a respective data period of one horizontal period 1H, corresponding data signals R, G, and B may be supplied to respective pixels 140 of each pixel unit. That is, e.g., each of the pixel units may include one pixel 140 for emitting red light, one pixel 140 for emitting green light and one pixel 140 for emitting blue light.

In some embodiments, as the data signals may be respectively supplied to the pixels 140 only during a corresponding data period of a horizontal period 1H, the data signals may not overlap with, i.e., occur at a same time as, the scan signals supplied during a scan period of the same horizontal period 1H. Further, the data driver 120 may supply dummy data DD, which do not contribute to brightness of the respective pixel 140, during the scan period of each horizontal period 1H. However, embodiments of the invention are not limited thereto. For example, in some embodiments, no dummy data DD may be supplied during the scan period of each horizontal period 1H.

The demultiplexer controller 170 may supply i number of control signals CS-1 to CS-i to each of the demultiplexers 162-1 to 162-Om/i during the data period of one horizontal period 1H. Thus, the i data signals, supplied to each of the demultiplexers 162-1 to 162-Om/i via the respective one of the output lines O1 to Om/I, may be divided and respectively supplied to the i number of data lines D associated with the respective demultiplexer 162-1 to 162-Om/i based on the respective control signal CS-1 to CS-i. Referring to FIG. 2, in some embodiments, the demultiplexer controller 170 may sequentially supply the i control signals CS-1 to CS-i during each data period. Thus, the i control signals CS-1 to CS-i may not overlap each other, i.e., occur at a same time, as shown in FIG. 2.

Although FIG. 1 shows that the demultiplexer controller 170 as a separate and external entity than the timing controller 150, embodiments of the invention are not limited thereto. For example, the demultiplexer controller 170 may be included within the timing controller 150.

In some embodiments, there may a same number of the data capacitors Cdata as a number of data lines D1 to Dm. In such embodiments, e.g., one of the data capacitors Cdata1 to Cdatam may be coupled to each of the data lines D1 to Dm. The data capacitors Cdata1 to Cdatam may temporarily store the data signal supplied to the respective data line D1 to Dm to which it is coupled. The data capacitor Cdata may supply the stored data signal to the pixel 140 associated therewith. The data capacitor Cdata may be a parasitic capacitor equivalent to the respective data line D, i.e., corresponding to characteristics of the respective data line D1 to Dm. The data capacitors Cdata1 to Cdatam, e.g., parasitic capacitors corresponding to each of the data lines D1 to Dm, may have a larger capacitance than that of a storage capacitor (described below), which may be included in each of the pixels 140.

Figure 3:
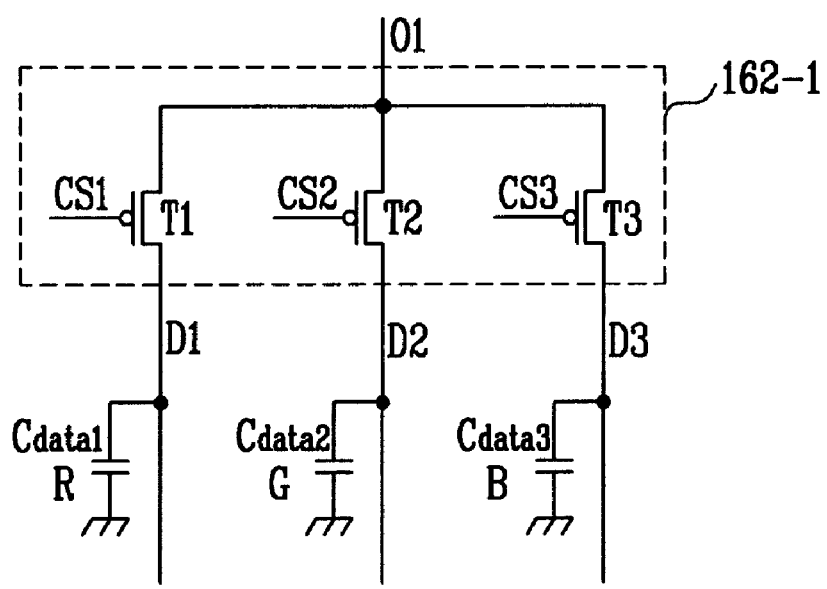
FIG. 3 illustrates a circuit diagram of an exemplary demultiplexer employable by the organic light emitting display shown in FIG. 1.

FIG. 3 illustrates a circuit diagram of an exemplary demultiplexer employable by the organic light emitting display shown in FIG. 1.

In the exemplary embodiment illustrated in FIG. 3, i is equal to 3. However, embodiments of the invention are not limited thereto. Further, FIG. 3 shows the first demultiplexer 162-1 coupled to the first output line O1, as an exemplary demultiplexer. However, embodiments of the invention are not limited thereto. For example, one, some or all of the demultiplexers 162 of the demultiplexer controller 160 may have the characteristics described below with regard to the first demultiplexer 162-1.

Referring to FIG. 3, in embodiments in which i is equal to 3, the demultiplexer 162 may include a first switching device T1, a second switching device T2, and a third switching device T3. In embodiments, the demultiplexers 162-1 to 162Om/i may include i number of switching devices T.

The first switching device T1 may be coupled between the first output line O1 and the first data line D1. The first switching device T1 may be turned on when the first control signal CS1 is supplied, e.g., changed to a low voltage level, from the demultiplexer controller 170. The first switching device T1 may supply the data signal from the first output line O1 to the first data line D1. When the first control signal CS1 is supplied, the data signal supplied to the first data line D1 may be temporarily stored in the first data capacitor Cdata1(R) coupled thereto.

The second switching device T2 may be coupled between the first output line O1 and the second data line D2. The second switching device T2 may be turned on when the second control signal CS2 is supplied from the demultiplexer controller 170. The second switching device T2 may supply the data signal from the first output line O1 to the second data line D2. When the second control signal CS2 is supplied, the data signal supplied to the second data line D2 may be temporarily stored in the second data capacitor Cdata2(G) coupled thereto.

The third switching device T3 may be coupled between the first output line O1 and the third data line D3. The third switching device T3 may be turned on when the third control signal CS3 is supplied from the demultiplexer controller 170. The third switching device T3 may supply the data signal from the first output line O1 to the third data line D3. When the third control signal CS3 is supplied, the data signal supplied to the third data line D3 may be temporarily stored in the third data capacitor Cdata3(B) coupled thereto.

Figure 4:
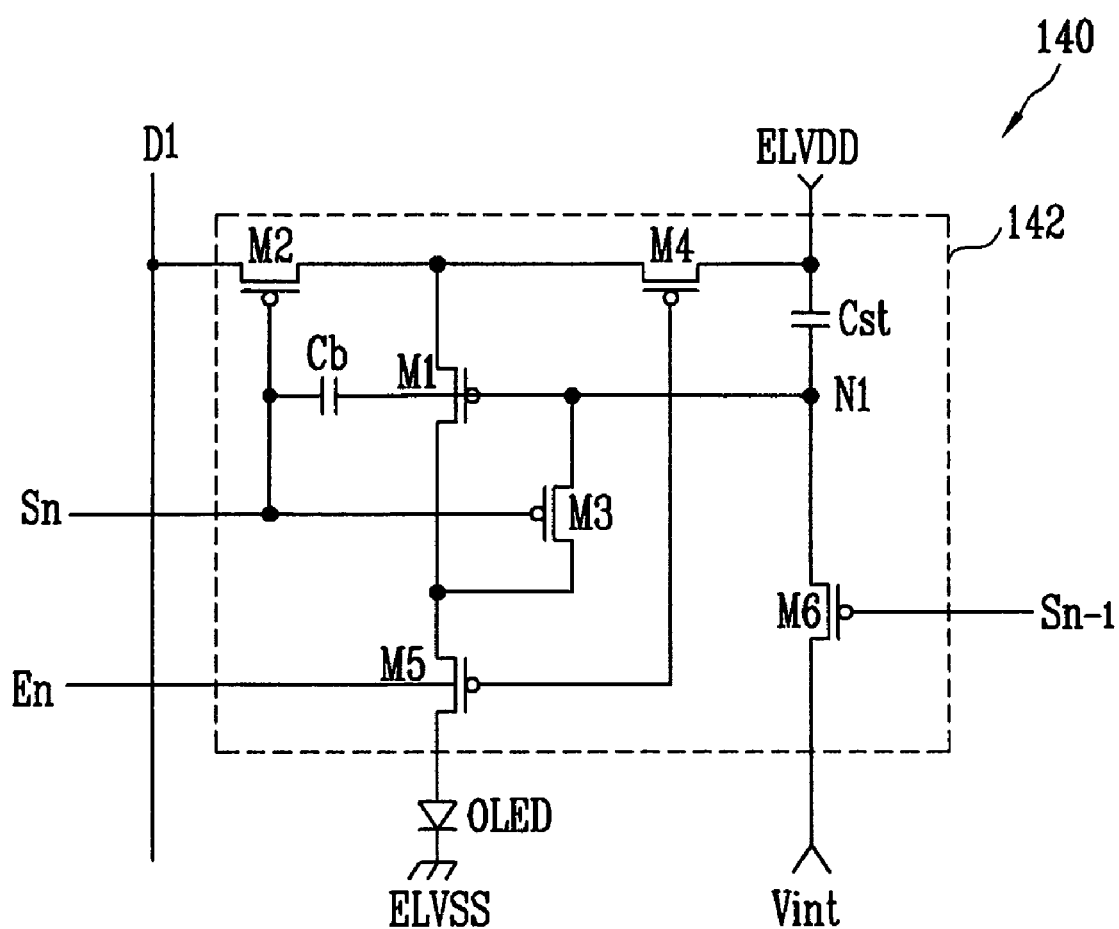
FIG. 4 illustrates a circuit diagram of an exemplary embodiment of a pixel employable by the organic light emitting display shown in FIG. 1.

FIG. 4 illustrates a circuit diagram of an exemplary embodiment of a pixel employable by the organic light emitting display shown in FIG. 1.

Referring to FIG. 4, each of the pixels 140 according to an exemplary embodiment of the invention may include a pixel circuit 142 coupled to an organic light emitting diode OLED, a respective one of the data lines D1 to Dm, a respective one of the scan lines S1 to Sn, and a respective one of the light emission control lines E1 to En. A combination of corresponding ones of the data signals, scan signals and light emission control signals may respectively control the organic light emitting diodes OLEDs of the pixels 140. The exemplary pixel 140 illustrated in FIG. 4 is connected to the first data line D1, the nth scan line Sn and the nth emission line En.

An anode electrode of the organic light emitting diode OLED may be coupled to the pixel circuit 142, and a cathode electrode thereof may be coupled to a second power source ELVSS. A voltage of the second power source ELVSS may be lower than that of the first power source ELVDD. The organic light emitting diode OLED may produce a light of, e.g., one of red color, green color, and blue color based on an amount of current supplied from the pixel circuit 142.

The pixel circuit 142 may include a storage capacitor Cst, a first transistor M1, a second transistor M2, a third transistor M3, a fourth transistor M4, a fifth transistor M5, a sixth transistor M6, and a boosting capacitor Cb. The storage capacitor Cst may be coupled between the first power source ELVDD and an initialization power source Vint. The first transistor M1 may include a first electrode coupled between a first electrode of the second transistor M2 and a first electrode of the fourth transistor M4, a second electrode coupled to a first electrode of the third transistor M3 and a first electrode of the fifth transistor M5, and a control electrode coupled to a first node N1. The first node N1 may correspond to a second electrode of the third transistor M3, a first electrode of the boosting capacitor Cb and a first electrode of the storage capacitor Cst. A second electrode of the storage capacitor Cst may be coupled to the first power source ELVDD and a second electrode of the fourth transistor M4. A second electrode of the boosting capacitor Cb may be coupled to a control electrode of the second transistor M2, a control electrode of the third transistor M3 and the nth scan line Sn. A second electrode of the second transistor M2 may be coupled to the first data line D1. A control electrode of the fourth transistor M4 and a control electrode of the fifth transistor M5 may be coupled to the nth light emission control line En. A second electrode of the fifth transistor M5 may be coupled to the anode of the organic light emitting diode OLED. A first terminal of the sixth transistor M6 may be coupled to the first node N1, a second electrode of the sixth transistor M6 may be coupled to the initialization power source Vint, and a control electrode of the sixth transistor M6 may be coupled to the (n−1)th scan line Sn−1.

With regard to the exemplary first, second, third, fourth, fifth and sixth transistors of the exemplary pixel circuit 142 described herein, the first electrodes thereof may be one of a drain electrode and a source electrode, and the second electrode thereof may be the other of a drain electrode and a source electrode. For example, if the first electrode of the first transistor M1 is the source electrode, the second electrode of the first transistor M1 may be the drain electrode. Further, although the first, second, third, fourth, fifth and sixth transistors M1, M2, M3, M4, M5 and M6 are illustrated as P-type MOSFETS, embodiments of the invention are not limited thereto. Further, as well known to those skilled in the art, if the first, second, third, fourth, fifth and sixth transistors M1, M2, M3, M4, M5 and M6 are N-type MOSFETs, the polarity of driving signals employed for driving the first, second, third, fourth, fifth and sixth transistors M1, M2, M3, M4, M5 and M6 may be reversed.

The first transistor M1 may supply a current corresponding to the voltage charged in the storage capacitor Cst, i.e. the voltage applied to the first node N1 to the organic light emitting diode OLED.

The second transistor M2 may be turned on when a scan signal is supplied to the nth scan line Sn, e.g., when the scan signal is changed to a low voltage level. When the second transistor M2 is turned on, the second transistor M2 may supply the data signal supplied to the data line D1 to the first electrode of the first transistor M1.

The third transistor M3 may be turned on when a scan signal is supplied to the nth scan line Sn, e.g., when the scan signal is changed to a low voltage level. The third transistor M3 may couple the first transistor M1 in a diode-coupled manner. That is, when the third transistor M3 is turned on, the first transistor M1 may be coupled in the form of a diode, i.e., may function as a diode.

The fourth transistor M4 may be turned on when a light emission control signal is not supplied, e.g., when a light emission control signal having a low voltage level is supplied. The fourth transistor M4 may be turned on to electrically connect the first power source ELVDD and the first transistor M1.

The fifth transistor M5 may be turned on when a light emission control signal is not supplied, e.g., when a light emission control signal having a low voltage level is supplied. The fifth transistor M5 may be turned on to electrically connect the first transistor M1 and the organic light emitting diode OLED.

The sixth transistor M6 may be turned on when a scan signal is supplied to the (n−1)th scan line Sn−1, e.g., when a scan signal having a low voltage level is supplied. The sixth transistor M6 may be turned on to initialize the first node N1. A voltage value of the initialization power source Vint may be set to be lower than the voltage value of the data signal.

The boosting capacitor Cb may increase the voltage of the first node N1 when the supply of the scan signal to the nth scan line Sn is stopped.

The storage capacitor Cst may store a voltage corresponding to the data signal supplied to the data line D1.

Figure 5:
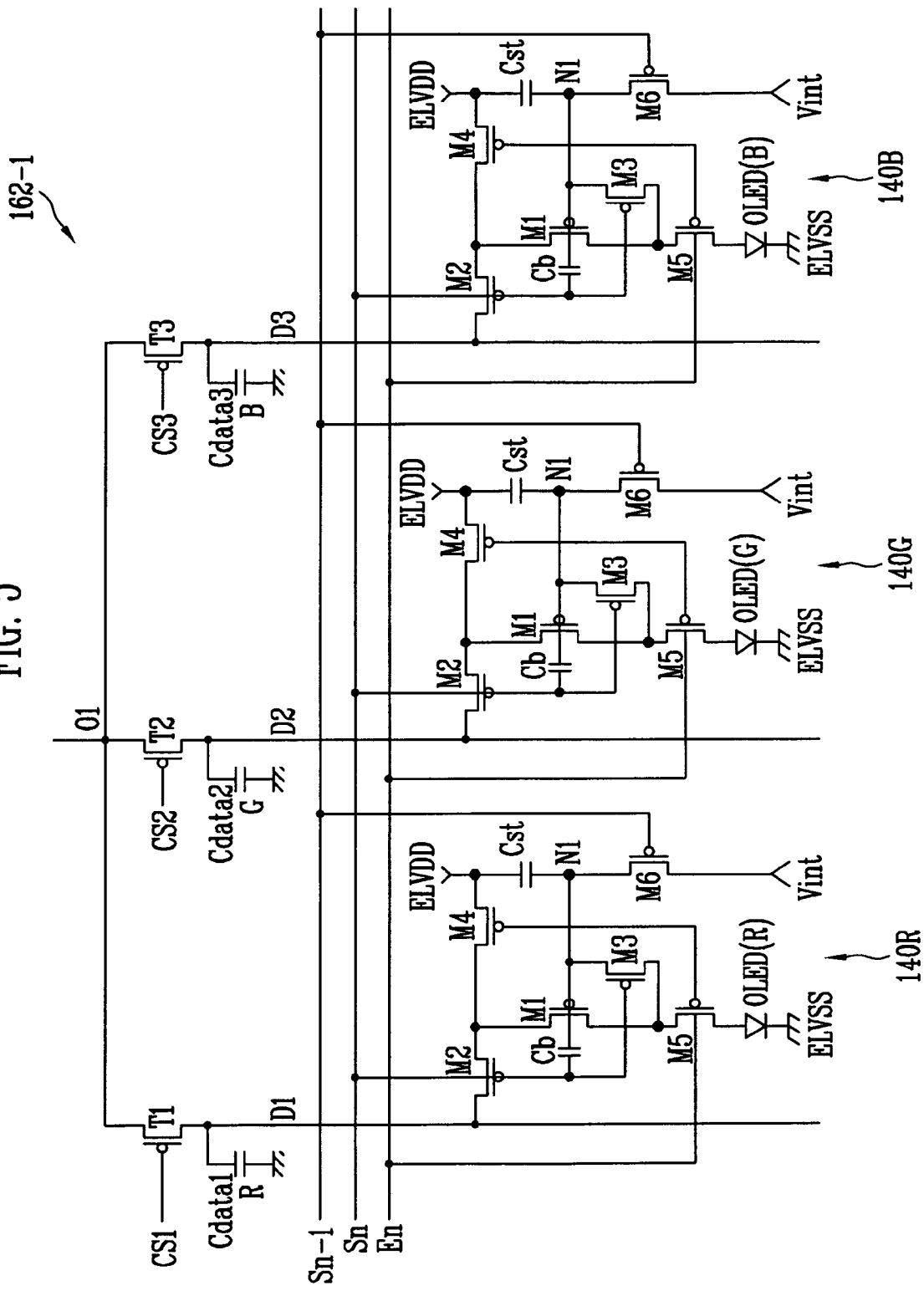
FIG. 5 illustrates a circuit diagram of an exemplary coupling scheme for connecting the demultiplexer of FIG. 3 and the pixel of FIG. 4.

FIG. 5 illustrates a circuit diagram of an exemplary coupling scheme for coupling the demultiplexer 162-1 of FIG. 3 and a plurality of the pixels 140R, 140G, 140B according to the exemplary pixel 140 illustrated in FIG. 4. That is, each of the pixels 140R, 140G and 140B illustrated in FIG. 5 correspond to the exemplary pixel 140 illustrated in FIG. 4.

Hereinafter, exemplary operation of each of the pixels 140R, 140G, 140B will be described in detail with reference to FIGS. 2 through 5. First, the respective scan signal may be supplied to the (n−1)th scan line Sn−1 during a scan period of one horizontal period 1H. When the scan signal is supplied to the (n−1)th scan line Sn−1, the six transistor M6 included in each of the pixels 140R, 140G, and 140B is turned on. If the sixth transistor M6 is turned on, the storage capacitor Cst and the control electrode of the first transistor M1 may be coupled to the initialization power source Vint. Thus, the storage capacitor Cst and the control electrode of the first transistor M1 may be initialized to a voltage of the initialization power source Vint.

Thereafter, the first switching device T1, the second switching device T2, and the third switching device T3 of the demultiplexer 162-1 may be sequentially turned on by the first, second and third control signals CS1, CS2, CS3 sequentially supplied during the respective data period. If the first switching device T1 is turned on, a voltage corresponding to the data signal may be charged in the first data capacitor Cdata1(R) coupled to the first data line D1. If the second switching device T2 is turned on, a voltage corresponding to the data signal may be charged in the second data capacitor Cdata2(G) coupled to the second data line D2. If the third switching device T3 is turned on, a voltage corresponding to the data signal may be charged in the third data capacitor Cdata3(B) coupled to the third data line D1. If the second transistor M2 included in each of the pixels 140R, 140G, and 140B is turned off, a respective data signal is not supplied to the pixels 140R, 140G, and 140B.

Thereafter, a scan signal may be supplied to the nth scan line Sn for the scan period following the data period, i.e., the scan period following the data period of a same horizontal period 1H. If the scan signal is supplied to the nth scan line Sn, the second transistor M2 and the third transistor M3 included in the pixels 140R, 140G, and 140B may be turned on. If the second transistor M2 and the third transistor M3 included in the pixels 140R, 140G, and 140B are turned on, the voltages corresponding to the respective data signals stored in the first, second and third data capacitors Cdata1(R), Cdata2(G), Cdata3(B) may be supplied to the pixels 140R, 140G, and 140B.

As discussed above, a voltage of the control electrode of the first transistor M1 included in each of the pixels 140R, 140G, and 140B may have been initialized by the initialization power source Vint when the (n−1)th scan signal Sn−1 was supplied. Thus, because the voltage of the control electrode of the first transistor M1 included in each of the pixels 140R, 140G, and 140B may be lower than the voltage of the respective data signal, the first transistor M1 is turned on. If the first transistor M1 is turned on, the respective data signal is supplied to the first node N1 via the first transistor M1 and the third transistor M3. Then, a voltage corresponding to the respective data signal is charged in the storage capacitor Cst included in each of the pixels 140R, 140G, and 140B. A voltage corresponding to the threshold voltage of the first transistor M1 may be charged in the storage capacitor Cst in addition to the voltage corresponding to the respective data signal.

However, a voltage lower than a predetermined voltage may be supplied to the first node N1 of each of the pixels 140R, 140G, and 140B due to charge sharing of the data capacitor Cdata and the storage capacitor Cst. That is, due to charge sharing, a predetermined voltage may not be charged in the storage capacitor Cst.

Figure 6:
FIG. 6 illustrates a diagram of a scan signal supplied to a scan line.

Thereafter, supply of the scan signal to the nth scan line Sn may be stopped. FIG. 6 illustrates a diagram of a scan signal supplied to a scan line. Thus, e.g., as shown in FIG. 6, the voltage of the nth scan line Sn may be increased from the voltage of a fourth power source VVSS to a voltage of a third power source VVDD.

Here, the fourth power source VVSS may be a voltage supplied when a scan signal is supplied, and may be set to a voltage capable of turning on the second transistor M2 and the third transistor M3. The third power source VVDD may be a voltage supplied when the supply of a scan signal is stopped, and may be set to a voltage capable of turning off the second transistor M2 and the third transistor M3.

When the supply of a scan signal to the nth scan line Sn is stopped, the first node N1 may be set to a floating state. Therefore, when the supply of a scan signal to the nth scan line Sn is stopped, the voltage of the first node N1 may be increased by the boosting capacitor Cb. Here, the voltage increase of the first node N1 may be determined by Formula 1.

$$\text{Voltage Increase of } N1 = Cb/(Cb+Cst) \times (VVDD-VVSS) \quad \text{[Formula 1]}$$

Referring to Formula 1, the voltage increase of the first node N1 may be determined by the voltage difference between the voltage of the third power source VVDD and the voltage of the fourth power source VVSS (VVDD−VVSS) of the scan signal supplied to the nth scan line Sn and the capacitances of the boosting capacitor Cb and the storage capacitor Cst. That is, a voltage increase of the first node N1 may be controlled by regulating the voltages of the third power source VVDD and the fourth power source VVSS. By increasing a voltage of the first node N1, a voltage lost as a result of the charge sharing between the respective data capacitor Cdata and the respective storage capacitor Cst may be compensated for. Accordingly, a predetermined gradation may be expressed.

In embodiments, a capacitance of the storage capacitor Cst may be set to be higher than a capacitance of the boosting capacitor Cb so that the voltage of the first node N1 may be increased by a predetermined difference. For example, in some embodiments, a voltage difference between the third power source VVDD and the fourth power source VVSS may be set to be about 10 V or more. Therefore, if the capacitance of the boosting capacitor Cb is higher than that of the storage capacitor Cst, the voltage of the first node N1 may be increased above a predetermined voltage. Thus, to avoid this, some embodiments of the invention may set the capacitance of the boosting capacitor Cb to be lower than that of the storage capacitor Cst.

After the supply of a scan signal to the nth scan line Sn is stopped and the voltage of the first node N1 is increased, the supply of a light emission control signal to the nth light emission control line En may be stopped. Then, the fourth transistor M4 and the fifth transistor M5 may be turned on, and a current corresponding to a voltage charged in the storage capacitor Cst is supplied to the organic light emitting diode OLED.

Figure 7:
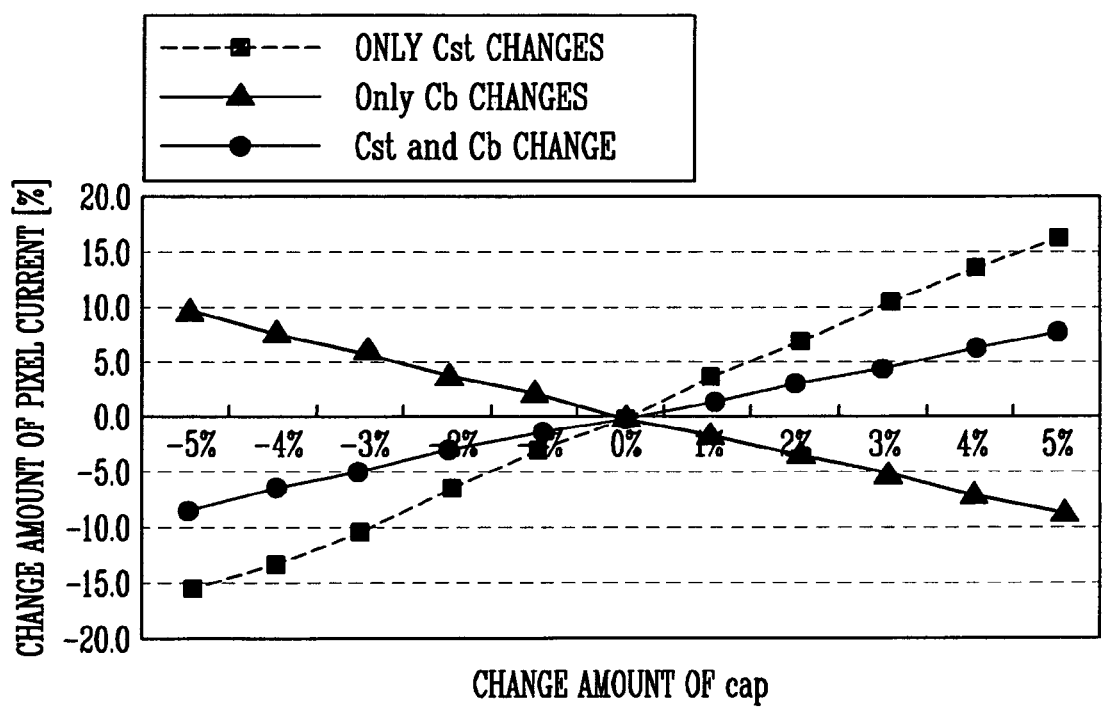
FIG. 7 illustrates a graph of relationships between pixel current and capacitances of a storage capacitor and a boosting capacitor of the pixel illustrated in FIG. 4.

FIG. 7 illustrates a graph of relationships between pixel current and capacitances of the storage capacitor Cst and a boosting capacitor Cb of the pixel 140 illustrated in FIG. 4.

First, in the graph of FIG. 7, the W/L of each of the transistors M1 to M6 and the capacitances of the storage and boosting capacitors Cst and Cb are set as provided in Table 1.

TABLE 1

| | |
|---|---|
| M1 | 7 μm/24 μm |
| M2 | 5 μm/7 μm |
| M3 | 5 μm/7 μm + 5 μm/9 μm (dual) |
| M4 | 5 μm/7 μm |
| M5 | 5 μm/7 μm |
| M6 | 5 μm/7 μm (dual) |
| Cst | 0.36 pF |
| Cb | 0.04 pF |

In FIG. 7, the line passing through square symbols (■) corresponds to an amount of current (pixel current) supplied to the organic light emitting diode OLED relative to capacitance of the storage capacitor Cst, where the capacitance of the storage capacitor Cst is changed by −5% to 5%. The line passing through the triangular symbols (▲) corresponds to an amount of current (pixel current) supplied to the organic light emitting diode OLED relative to capacitance of the boosting capacitor Cb, where the capacitance of the boosting capacitor is changed by −5% to 5%. The line passing through the circular symbols (●) corresponds to an amount of current (pixel current) supplied to the organic light emitting diode OLED relative to capacitances of the storage capacitor Cst and the boosting capacitor Cb, where the capacitance of the storage capacitor Cst and the boosting capacitor Cb are changed by a same amount. More particularly, the line passing through the circular symbols (●) corresponds to an amount of current (pixel current) supplied to the organic light emitting diode OLED relative to capacitances of the storage capacitor Cst and the boosting capacitor Cb, where the capacitance of the storage capacitor Cst and the boosting capacitor Cb are changed by a same magnitude, e.g., the capacitance of the storage capacitor Cst is increased by a same amount by which the capacitance of the boosting capacitor Cb is decreased.

Referring to FIG. 7, as the capacitance of the storage capacitor Cst increases, the pixel current increases. Further, as the capacitance of the boosting capacitor Cb increases, the pixel current decreases. In embodiments, the capacitance of the storage capacitor Cst may be increased while the capacitance of the boosting capacitor Cb is decreased, i.e., the capacitances of the storage capacitor Cst and the boosting capacitor Cb may be simultaneously increased and decreased, respectively. Thus, an amount of change in pixel current may be less than cases in which only the capacitance of one of the capacitors is changed, e.g., the capacitance of the storage capacitor Cst is increased or the capacitance of the boosting capacitor Cb is decreased.

As a result, in embodiments, an influence of the capacitors Cst and Cb on the pixel current may be minimized by regulating the capacitances of the storage capacitor Cst and the boosting capacitor Cb.

Figure 8:
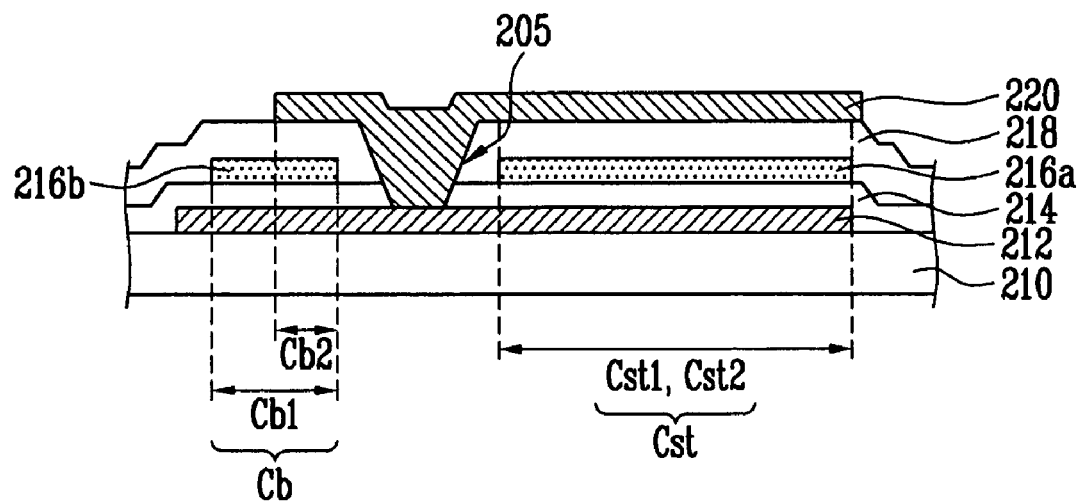
FIG. 8 illustrates a cross-sectional view of an exemplary storage capacitor and an exemplary boosting capacitor according to an embodiment of the invention.

FIG. 8 illustrates a cross-sectional view of an exemplary storage capacitor and an exemplary boosting capacitor according to an exemplary embodiment of the invention. For convenience, only the exemplary storage and boosting capacitors Cst, Cb are shown. Embodiments of the invention are not limited thereto. For example, a plurality of transistors may be additionally formed in the pixel region.

Referring to FIG. 8, each of the pixels 140 may include a semiconductor layer 212 formed on a substrate 210, a first electrode layer 216a, a second electrode layer 216b, and a third electrode layer 220. The semiconductor layer 212 on the substrate 210 may constitute the capacitors Cb and Cst. In embodiments, the boosting and/or storage capacitors Cb and Cst may have a dual capacitor structure, which may aid in obtaining a sufficient capacitance.

Further, each of the pixels 140 may further include a first insulation film 214 and a second insulation film 218. The first insulation film 214 and the second insulation film 218 may insulate the semiconductor layer 212, the first electrode layer 216a, the second electrode layer 216b, and the third electrode layer 220. For example, the first insulation film 214 may be between the semiconductor layer 212 and the first electrode layer 216a and the second electrode layer 216b, and the second insulation film 218 may be between the first electrode layer 216a and the second electrode layer 216b and the third electrode layer 220.

Referring to FIG. 8, an exemplary method of manufacturing the storage capacitor Cst and the boosting capacitor Cb of the pixel 140 according to an exemplary embodiment will be described. As shown in FIG. 8, the semiconductor layer 212 may be formed on the substrate 210. More particularly, in some embodiments, the semiconductor layer 212 may be simultaneously formed of the same material as the semiconductor layer forming channels of the transistors. For example, the semiconductor 212 may include poly-Si.

After the semiconductor layer 212 is formed on the substrate 210, the first insulation film 214 may be formed on the semiconductor layer 212. Thereafter, the first electrode layer 216a may be formed in a storage capacitor Cst forming region and the second electrode layer 216b may be formed in a boosting capacitor Cb forming region. The first electrode layer 261 and the second electrode layer 216b may be formed simultaneously. More particularly, the first electrode layer 216a and the second electrode layer 216b may be simultaneously formed of the same material as the control electrodes of the transistors of the pixel 140. The first insulation film 214 may electrically insulate the first electrode layer 216a, the second electrode layer 216b, and the semiconductor layer 212 from each other.

More particularly, in some embodiments, a capacitance of the storage capacitor Cst may be set to be higher than that of the boosting capacitor Cb. Thus, in some embodiments, as shown in FIG. 8, a length of the first electrode layer 216a (corresponding to distance between arrows Cst1) may be set to be longer than a length of the second electrode 216b (corresponding to distance between arrows Cb1).

After the first electrode layer 216a and the second electrode layer 216b are formed, the second insulation film 218 may be formed so as to cover the first electrode layer 216a and the second electrode layer 216b. After the second insulation film 218 is formed, a contact hole 205 may be formed so that a portion of the semiconductor layer 212 may be exposed between the first electrode layer 216a and the second electrode layer 216b. The third electrode layer 220 may be formed on the second insulation layer 218. The third electrode layer 220 may be coupled to the semiconductor layer 212 through the contact hole 205.

In some embodiments, as shown in FIG. 8, the third electrode layer 220 may be formed so that a length of a portion of the third electrode layer 220, which overlaps the first electrode layer 216a (corresponding to distance between arrows Cst2), may be longer than that of a portion of the third electrode layer 220, which overlaps the second electrode layer 216b (corresponding to distance between arrows Cb2).

Accordingly, in some embodiments, a combination of a first sub-boosting capacitor Cb1 and a second sub-boosting capacitor Cb2 may correspond to the boosting capacitor Cb of FIGS. 4 and 5, and a combination of a first sub-storage capacitor Cst1 and a second sub-storage capacitor Cst2 may correspond to the storage capacitor Cst of FIGS. 4 and 5. More particularly, in some embodiments, respective overlapping portions of the semiconductor layer 212, first insulation film 214 and the first electrode layer 216a may form the first sub-storage capacitor Cst1. Respective overlapping portions of the semiconductor layer 212, first insulation film 214 and the second electrode layer 216b may form the first sub-boosting capacitor Cb1. Respective overlapping portions of the first electrode layer 216a, the second insulation film 218 and the third electrode layer 220 may form the second sub-storage capacitor Cst2. Respective overlapping portions of the second electrode layer 216b, the second insulation film 218 and the third electrode layer 220 may form the second sub-boosting capacitor Cb2.

In some embodiments, the boosting capacitor Cb and the storage capacitor Cst may be formed to satisfy the condition of Formula 2.

$$(Cb1/Cb2) > (Cst1/Cst2) \quad \text{[Formula 2]}$$

Referring to Formula 2, since the storage capacitor Cst and the boosting capacitor Cb may have the same change ratios, a resulting amount of change in pixel current may be minimized and/or reduced. For example, in a case in which a ratio between the first sub-storage capacitor Cst1 and the second sub-storage capacitor Cst2 is below 10, a ratio between the first sub-boosting capacitor Cb1 and the second sub-boosting capacitor Cb2 may be above 10.

Figure 9:
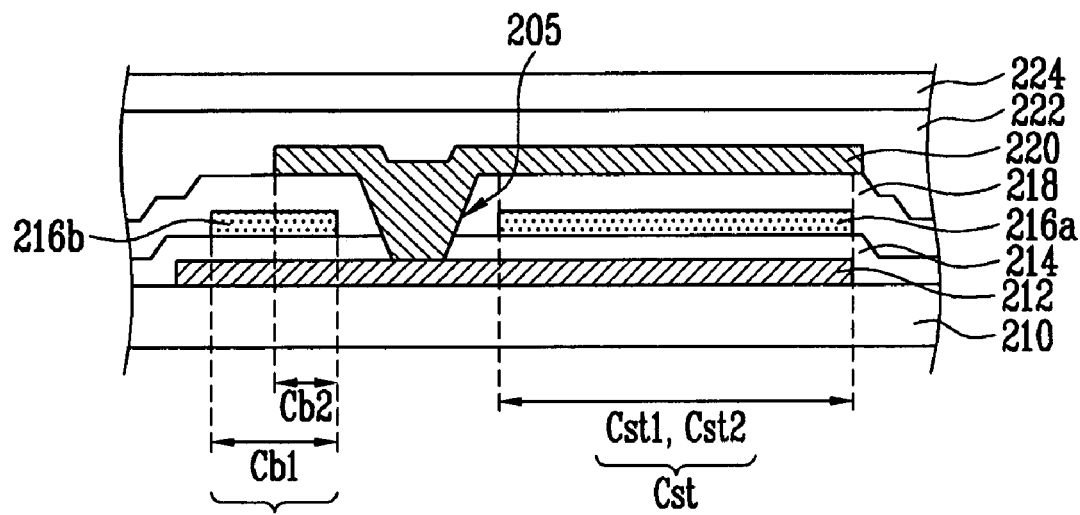
FIG. 9 illustrates a cross-sectional view of the exemplary storage capacitor and the exemplary boosting capacitor shown in FIG. 8 with an additional layer formed thereon.

FIG. 9 illustrates a cross-sectional view of the exemplary storage capacitor and the exemplary boosting capacitor shown in FIG. 8 with additional layers formed thereon.

Additional layers may be formed on the second electrode layer 220 of FIG. 8 as a result of forming, e.g., a transistor(s) of the pixel 140. For example, as shown in FIG. 9, a third insulation layer 222 (or a planarization layer) and an organic light emitting diode layer 224 may be formed on the third electrode layer 220.

As mentioned above, in the organic light emitting display and the method for manufacturing the organic light emitting display according to an embodiment of the invention, an change in an amount of pixel current may be minimized, or at least reduced, by regulating capacitances of capacitors, e.g., a storage capacitor and a boosting capacitor, included in each pixel. Thus, embodiments of the invention may enable an image of a predetermined brightness to be displayed.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display including a boosting capacitor and a storage capacitor in each pixel region thereof, the light emitting display comprising:
    a substrate;
    a semiconductor layer on the substrate;
    a first insulation layer on the semiconductor layer;
    a first electrode layer and a second electrode layer on the first insulation layer, the first electrode layer having a first length and the second electrode layer having a second length, the first electrode layer corresponding to the storage capacitor, the second electrode layer corresponding to the boosting capacitor;
    a second insulation layer on the first electrode layer and the second electrode layer; and
    a third electrode layer on the second insulation layer,
    wherein a length of a first portion of the third electrode layer that overlaps the first electrode layer is longer than a length of a second portion of the third electrode layer that overlaps the second electrode layer.

2. The organic light emitting display as claimed in claim 1, wherein the third electrode layer is electrically coupled to the semiconductor layer via a contact hole.

3. The organic light emitting display as claimed in claim 1, wherein overlapping portions of the semiconductor layer and the second electrode layer correspond to a first sub-boosting capacitor and overlapping portions of the second electrode layer and the second portion of the third electrode layer correspond to a second sub-boosting capacitor, and the first sub-boosting capacitor and the second sub-boosting capacitor together correspond to the boosting capacitor.

4. The organic light emitting display as claimed in claim 3, wherein overlapping portions of the semiconductor layer and the first electrode layer correspond to a first sub-storage capacitor and overlapping portions of the first electrode layer and the first portion of the third electrode layer correspond to a second sub-storage capacitor, and the first sub-storage capacitor and the second sub-storage capacitor together correspond to the storage capacitor.

5. The organic light emitting display as claimed in claim 4, wherein:
    a boosting ratio corresponding to a capacitance of the first sub-boosting capacitor divided by a capacitance of the second sub-boosting capacitor is greater than a storage ratio corresponding to a capacitance of the first storage capacitor divided by a capacitance of the second storage capacitor.

6. The organic light emitting display as claimed in claim 1, wherein overlapping portions of the semiconductor layer and the first electrode layer correspond to a first sub-storage capacitor and overlapping portions of the first electrode layer and the third electrode layer correspond to a second sub-storage capacitor, and the first sub-storage capacitor and the second sub-storage capacitor together correspond to the storage capacitor.

7. The organic light emitting display as claimed in claim 1, wherein a capacitance of the boosting capacitor is less than a capacitance of the storage capacitor.

8. The organic light emitting display as claimed in claim 1, wherein the second length is different from the first length.

9. The organic light emitting display as claimed in claim 8, wherein the first length is longer than the second length.

10. The organic light emitting display as claimed in claim 1, wherein a first terminal of the boosting capacitor is coupled to a first terminal of the storage capacitor, a second terminal of the boosting capacitor is coupled to a scan line, and a second terminal of the storage capacitor is coupled to a first power source.

11. A method of manufacturing an organic light emitting display, the method comprising:
    forming a semiconductor layer in each pixel region on a substrate;
    forming a first insulation layer on the semiconductor layer;
    forming a first electrode layer having a first length and corresponding to a storage capacitor and a second electrode layer having a second length, the first electrode layer corresponding to a storage capacitor and the second electrode corresponding to a boosting capacitor;
    forming a second insulation layer on the first electrode layer and the second electrode layer; and
    forming a third electrode layer on the second insulation layer,
    wherein a length of a first portion of the third electrode layer that overlaps the first electrode layer is longer than a length of a second portion of the third electrode layer that overlaps the second electrode layer.

12. The method as claimed in claim 11, further comprising:
    forming a contact hole exposing a portion of the semiconductor layer between the first electrode layer and the second electrode layer after forming the second insulation layer,
    wherein forming the third electrode layer comprises forming the third electrode layer by filling the contact hole so that the third electrode layer is electrically coupled to the semiconductor layer through the contact hole.

13. The method as claimed in claim 11, wherein a ratio of an overlapping area of the second electrode layer and the semiconductor layer divided by an overlapping area of the second electrode layer and the second portion of the third electrode layer is larger than an overlapping area of the first electrode layer and the semiconductor layer divided an overlapping area of the first electrode layer and the first portion of the third electrode layer.

14. The method as claimed in claim 11, further comprising:
   forming a third insulation layer on the third electrode layer; and
   forming an organic light emitting diode layer on the third insulation layer.

15. The method as claimed in claim 11, wherein the second length is different from the first length.

16. A light emitting display including a plurality of pixel regions, each pixel region, comprising:
   a plurality of transistors on a substrate;
   a boosting capacitor coupled between control electrodes of two of the plurality of transistors; and
   a storage capacitor including a first terminal coupled to a first terminal of the boosting capacitor and a second terminal coupled to a first power source,
   wherein:
   the boosting capacitor is adapted to increase a voltage at the first terminal of the storage capacitor,
   a capacitance of the boosting capacitor is less than a capacitance of the storage capacitor, and
   a change in the capacitance of the boosting capacitor is offset by a change in the capacitance of the storage capacitor.

* * * * *